United States Patent
Mizushima et al.

[11] Patent Number: 6,163,042
[45] Date of Patent: Dec. 19, 2000

[54] SEMICONDUCTOR INTEGRATED CIRCUIT

[75] Inventors: Takeo Mizushima; Hirohisa Masuda, both of Tokyo, Japan

[73] Assignee: Oki Electric Industry Co., Ltd., Tokyo, Japan

[21] Appl. No.: 09/184,848

[22] Filed: Nov. 3, 1998

[30] Foreign Application Priority Data

Jul. 2, 1998 [JP] Japan .................................. 10-187535

[51] Int. Cl.⁷ .................................................. H01L 27/10
[52] U.S. Cl. ............................................. 257/202; 257/203
[58] Field of Search .................................... 257/202, 203, 257/204, 205, 206

[56] References Cited

U.S. PATENT DOCUMENTS 5,859,448  1/1999  Brassington ............................ 257/203

FOREIGN PATENT DOCUMENTS

| 03165062 | 7/1991 | Japan . | |
|---|---|---|---|
| 03276670 | 12/1991 | Japan . | |
| 4-162669 | 6/1992 | Japan | 257/203 |
| 04184936 | 7/1992 | Japan . | |
| 06084915 | 3/1994 | Japan . | |
| 08330432 | 12/1996 | Japan . | |

*Primary Examiner*—J. Carroll
*Attorney, Agent, or Firm*—Jones Volentine, L.L.C.

[57] ABSTRACT

In order to solve the above-described problem, a semiconductor integrated circuit according to the present invention comprises a semiconductor chip, a core area formed over the semiconductor chip and comprised of predetermined circuits, and a plurality of input/output unit cells placed along peripheral edge portions of the semiconductor chip so as to surround the core area and shaped in the form of bent patterns. Further, a semiconductor integrated circuit according to another invention comprises a semiconductor chip, a core area formed over the semiconductor chip and comprised of predetermined circuits, and a plurality of input/output unit cells placed aslant toward peripheral portions of the semiconductor chip so as to surround the core area.

23 Claims, 2 Drawing Sheets

SEMICONDUCTOR INTEGRATED CIRCUIT

BACKGROUND OF THE INVENTION

1. Field of the Invention

This invention relates to a semiconductor integrated circuit, and particularly to shapes of input/output unit cells and a layout of a semiconductor integrated circuit equipped with the input/output unit cells.

2. Description of the Related Art

With recent high integration or improvements in performance of a semiconductor device, an increase in the number of pins and an increase in the number of input/output unit cells incident to its increase cannot be avoided. On the other hand, since the needs of users are to reduce a semiconductor chip in size and thickness, various developments in a semiconductor integrated circuit wherein input/output unit cells are turned into narrow pad-based pitches, have been pursued.

In the aforementioned conventional semiconductor integrated circuit, however, the input/output unit cells can be reduced in width owing to the turning thereof into the narrow pad-based pitches, whereas they increase in vertical height, thus resulting in the fact that a core area would be reduced in size as compared or by contrast with the same chip size and needless corner area portions would be greatly enlarged. In other words, this will bring about the result that the implementation of the turning of the input/output unit cells into the narrow pad-based pitches does not directly lead to an increase in the number of pins.

SUMMARY OF THE INVENTION

With the foregoing in view, it is therefore an object of the present invention to provide a semiconductor integrated circuit capable of sufficiently ensuring a core area as compared or by contrast with the same chip size, bringing needless corner area portions into required minimum spaces and implementing an increase in the number of pins according to the turning of input/output unit cells into narrow pad-based pitches.

According to one aspect of this invention, for achieving the above object, there is provided a semiconductor integrated circuit, comprising:

a semiconductor chip;

a core area formed over the semiconductor chip and comprised of predetermined circuits; and a plurality of input/output unit cells placed along peripheral edge portions of the semiconductor chip so as to surround the core area and be shaped in the form of bent patterns, respectively.

According to another aspect of this invention, there is provided a semiconductor integrated circuit, comprising:

a semiconductor chip;

a core area formed over the semiconductor chip and comprised of predetermined circuits; and a plurality of input/output unit cells placed aslant toward peripheral portions of the semiconductor chip so as to surround the core area.

Typical embodiments of the present invention have been shown in brief. However, the various embodiments of the present invention and specific configurations of these embodiments will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

First Embodiment

Figure 1:
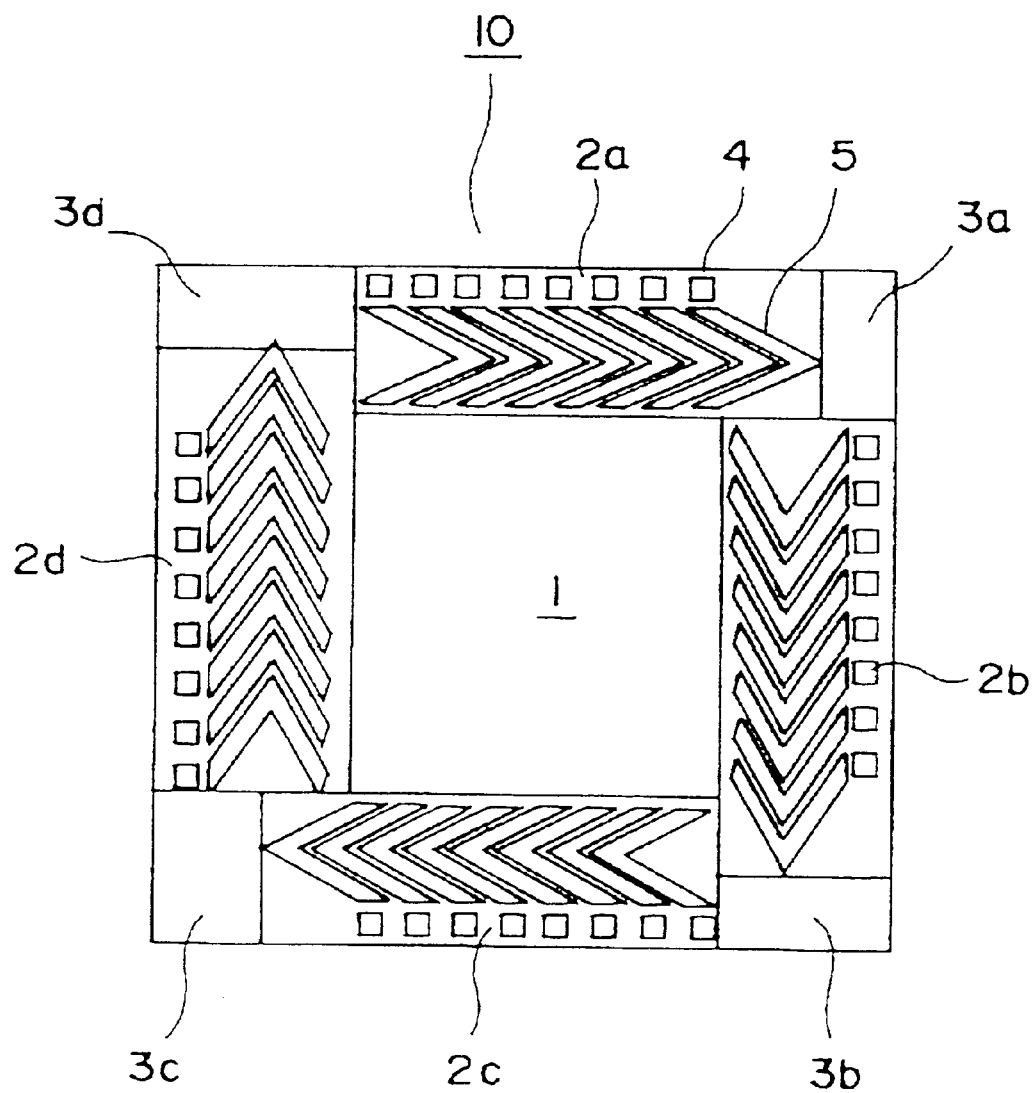
FIG. 1 is an explanatory diagram showing a first embodiment of the present invention.

FIG. 1 is an explanatory diagram showing a first embodiment of the present invention.

A semiconductor chip 10 shown in FIG. 1 is shaped in the form of a rectangle and comprises a core area 1 in which predetermined circuits are configured, input/output areas 2a through 2d, and corner cell areas 3a through 3d. Further, the input/output areas 2a through 2d are respectively provided with bonding pads 4 for respectively transmitting signals to and receiving signals from the outside, and input/output unit cells 5 each having an input circuit or an output circuit.

Although not shown in the drawing, a withdrawal electrode for power or ground wiring, an electrostatic protection circuit for preventing the breakdown of static electricity, etc. are placed in the corner cell areas 3a through 3d respectively.

The bonding pads 4 are electrically connected to their corresponding unillustrated leads on the package side by unillustrated bonding wires. Further, the input/output unit cells 5 are respectively electrically connected between the bonding pads 4 and the core area 1. The input circuit plays a role in supplying an externally incoming signal to each portion in a semiconductor integrated circuit, whereas the output circuit plays a role in outputting a signal generated in the semiconductor integrated circuit to the outside. Thus, the input and output circuits make common use of transistors larger in size than those used in other circuits lying inside the semiconductor chip 10.

Each input/output unit cell 5 is shaped in the form of a bent pattern (V-shaped in the present embodiment). The input/output unit cells 5 are respectively placed at equal intervals with respect to the input/output areas 2a through 2d along peripheral edge portions of the semiconductor chip 10. Further, the input/output unit cells 5 lying in the input/output areas 2a through 2d, which are opposed in position to each other with the core area 1 interposed therebetween, are arranged so as to be point-symmetrical with respect to each other about the core area 1. Described specifically, the input/output unit cells 5 lying in the input/output areas 2a and 2c and 2b and 2d are arranged so as to become point-symmetrical with respect to each other about the core area 1.

Incidentally, the above-described embodiment has described an example in which the input/output unit cells 5 placed in the input/output areas 2a and 2c and 2b and 2d are arranged so as to be point-symmetric with respect to each other about the core area 1. As an alternative to this, however, they may be arranged so as to become line-symmetric with respect to each other about the core area 1. Further, the shapes of the input/output areas 2a through 2d and corner cell areas 3a through 3d illustrated in FIG. 1 are merely shown by way of example for convenience of illustration. They are by no means limited to their configurations.

In the first embodiment as described above, the input/output unit cells are turned into narrow pad-based pitches, so that the input/output unit cells can be reduced not only in width but also in vertical height. Therefore, a sufficient core area can be ensured as compared or by contrast with the same chip size. Further, needless corner area portions can be formed into the required minimum spaces. Thus, a multi-pin configuration, i.e., an increase in the number of pins can be implemented.

Second Embodiment

Figure 2:
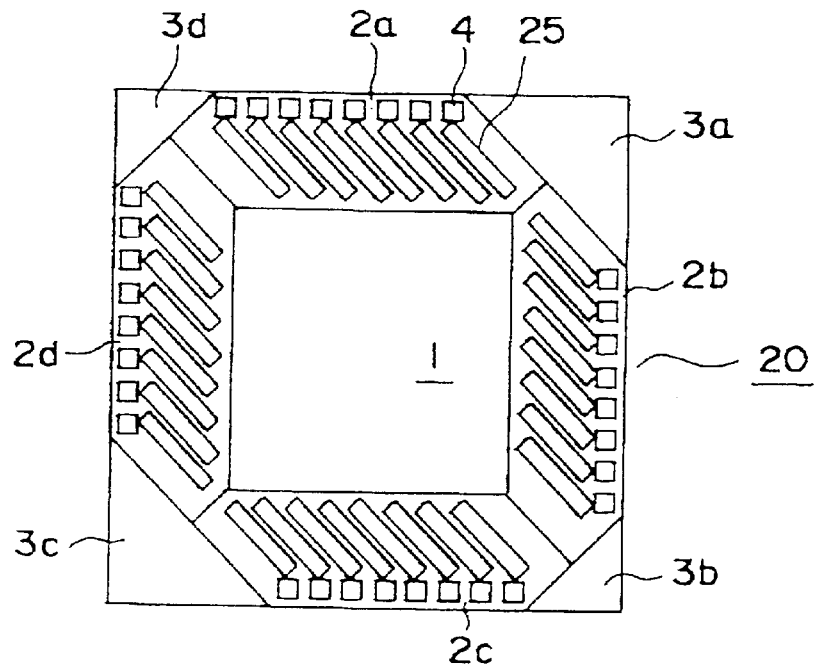
FIG. 2 is an explanatory diagram illustrating one example of a second embodiment of the present invention.
Figure 3:
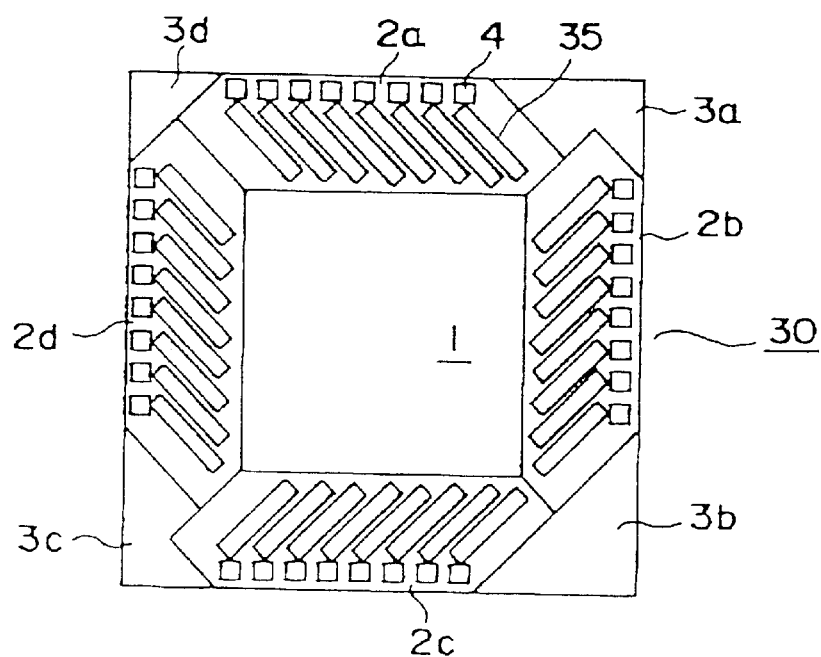
FIG. 3 is an explanatory diagram depicting another example of the second embodiment of the present invention

FIG. 2 is an explanatory diagram showing a second embodiment of the present invention. FIG. 3 is an explanatory diagram illustrating another example of the second embodiment of the present invention. Incidentally, the same elements of structure as those shown in FIG. 1 are identified by the same reference numerals and the description of certain common elements will therefore be omitted.

A semiconductor chip 20 shown in FIG. 2 is shaped in the form of a rectangle and comprises a core area 1 in which predetermined circuits are configured, input/output areas 2a through 2d, and corner cell areas 3a through 3d. Further, the input/output areas 2a through 2d are respectively provided with bonding pads 4 for respectively transmitting signals to and receiving signals from the outside, and input/output unit cells 25 each having an input circuit or an output circuit.

The input/output unit cells 25 are respectively placed aslant toward peripheral portions of the semiconductor chip 20 so as to surround the core area 1. The input/output unit cells 25 are placed aslant at the same intervals and in the same directions with respect to the input/output areas 2a through 2d. Further, the input/output,unit cells 25 lying in the input/output areas 2a through 2d, which are opposed in position to each other with the core area 1 interposed therebetween, are arranged so as to be point-symmetrical with respect to each other about the core area 1. Described specifically, the input/output unit cells 25 placed in the input/output areas 2a and 2c and 2b and 2d are arranged so as to become point-symmetrical with respect to each other about the core area 1.

Referring to FIG. 3 illustrative of another example of the second embodiment of the present invention, input/output unit cells 35 are respectively placed aslant toward peripheral portions of a semiconductor chip 30 so as to surround a core area 1. The input/output unit cells 35 are placed at equal intervals with respect to the input/output areas 2a through 2d and disposed aslant in directions opposite to each other with respect to the input/output areas 2a and 2c and 2b and 2d respectively opposed to each other with the core area 1 interposed therebetween. In other words, the input/output unit cells 35 lying in the input/output areas 2a through 2d, which are opposed in position to each other with the core area 1 interposed therebetween, are arranged so as to be line-symmetrical with respect to each other about the core area 1. Described specifically, the input/output unit cells 35 lying in the input/output areas 2a and 2c and 2b and 2d are arranged so as to become line-symmetrical with respect to each other about the core area 1.

Although described repeatedly, the shapes of the input/output areas 2a through 2d and corner cell areas 3a through 3d illustrated in FIGS. 2 and 3 are merely shown by way of example for convenience of illustration in a manner similar to the first embodiment. They are by no means limited to their shapes.

It is needless to say that the inclination of each input/output unit cell 35 can be suitably selected according to each case. However, the present embodiment has described the examples (see FIGS. 2 and 3) in which the inclinations of the input/output unit cells 35 have been set as about 45 degrees.

According to the second embodiment, the problem of the prior art can be solved by simply making a very easy change in layout.

According to the semiconductor integrated circuit of the present invention, as has been described above in detail, the input/output unit cells can be reduced not only in width but also in vertical height. Therefore, a sufficient core area can be ensured as compared or by contrast with the same chip size. Further, needless corner area portions can be formed into the required minimum spaces. Thus, an increase in the number of pins can be implemented.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit comprising:
   a rectangular semiconductor chip having a central portion and a peripheral portion that includes a plurality of corner portions and a plurality of side portions;
   a core area formed in the central portion of said rectangular semiconductor chip, said core area including a plurality of circuits;
   a plurality of bonding pads formed in outer peripheral areas of the side portions;
   a plurality of input/output unit cells each of which includes an input/output circuit, said input/output unit cells being formed on inner peripheral areas of the side portions between said core and said bonding pads, each of said input/output unit cells having a predetermined width and being located slanted with respect to an edge of said rectangular semiconductor chip; and
   a plurality of corner cells formed in the corner portions.

2. The semiconductor integrated circuit according to claim 1, wherein said corner cells include a power source line, a ground line and an electrostatic protection circuit.

3. The semiconductor integrated circuit according to claim 1, wherein said input/output unit cells formed within a side portion are located parallel with respect to each other.

4. The semiconductor integrated circuit according to claim 1, wherein said input/output unit cells formed within a side portion are located at a same interval with respect to each other.

5. The semiconductor integrated circuit according to claim 1, wherein said bonding pads formed within a side portion are located at a same interval with respect to each other.

6. The semiconductor integrated circuit according to claim 1, wherein each of said input/output unit cells has a bent pattern shape.

7. The semiconductor integrated circuit according to claim 6, wherein each of said input/output unit cells has a V-shape.

8. The semiconductor integrated circuit according to claim 1, wherein each of said input/output unit cells are located so that an entire length thereof between said core area and said bonding pads is slanted with respect to an edge of said rectangular semiconductor chip.

9. A semiconductor integrated circuit comprising:

a rectangular semiconductor chip having a central portion, a plurality of inner side portions surrounding the central portion, a plurality of outer side portions each of which is located between an edge of said rectangular semiconductor chip and one of the inner side portions, and a plurality corner portions located at corners of said rectangular semiconductor chip;

a core area formed in the central portion of said rectangular semiconductor chip, said core area including a plurality of circuits;

a plurality of bonding pads formed in the outer side portions;

a plurality of input/output unit cells each of which includes an input/output circuit, said input/output unit cells being formed in the inner side portions, each of said input/output unit cells having a predetermined width and being located slanted with respect to an edge of said rectangular semiconductor chip; and a plurality of corner cells formed in the corner portions.

10. The semiconductor integrated circuit according to claim 9, wherein said corner cells include a power source line, a ground line and an electrostatic protection circuit.

11. The semiconductor integrated circuit according to claim 9, wherein said input/output unit cells formed within an inner side portion are located parallel with respect to each other.

12. The semiconductor integrated circuit according to claim 9, wherein said input/output unit cells formed within an inner side portion are located at a same interval with respect to.

13. The semiconductor integrated circuit according to claim 9, wherein said bonding pads formed within an outer side portion are located at a same interval with respect to.

14. The semiconductor integrated circuit according to claim 9, wherein each of said input/output unit cells has a bent pattern shape.

15. The semiconductor integrated circuit according to claim 14, wherein each of said input/output unit cells has a V-shape.

16. The semiconductor integrated circuit according to claim 9, wherein each of said input/output unit cells are located so that an entire length thereof between said core area and the inner side portions is slanted with respect to an edge of said rectangular semiconductor chip.

17. A semiconductor integrated circuit comprising:

a rectangular semiconductor chip having a central portion, a first inner side portion located along a first edge of the central portion, a second inner side portion located along a second edge of the central portion which is located on a right side of the first edge, a third inner side portion located along a third edge of the central portion which is located on an opposite side of the first edge, a fourth inner side portion located along a fourth edge of the central portion which is located on a left side of the first edge, a plurality of outer side portions each of which is located between an edge of said rectangular semiconductor chip and one of the inner side portions, and a plurality corner portions located at corners of said rectangular semiconductor chip;

a core area formed in the central portion of said rectangular semiconductor chip, said core area including a plurality of circuits;

a plurality of bonding pads formed in the outer side portions;

a plurality of first input/output unit cells each of which includes an input/output circuit formed in the first inner side portion, each of said first input/output unit cells having a predetermined width, said first input/output unit cells being located parallel with respect to each other and slanted with respect to a first edge of said rectangular semiconductor chip which is adjacent to the first edge of the central area;

a plurality of second input/output unit cells each of which includes an input/output circuit formed in the second inner side portion, each of said second input/output unit cells having the predetermined width, said second input/output unit cells being located parallel with respect to each other and slanted with respect to a second edge of said rectangular semiconductor chip which is adjacent to the second edge of the central area;

a plurality of third input/output unit cells each of which includes an input/output circuit formed in the third inner side portion, each of said third input/output unit cells having the predetermined width, said third input/output unit cells being located parallel with respect to each other and slanted with respect to a third edge of said rectangular semiconductor chip which is adjacent to the third edge of the central area;

a plurality of fourth input/output unit cells each of which includes an input/output circuit formed in the fourth inner side portion, each of said fourth input/output unit cells having the predetermined width, said fourth input/output unit cells being located parallel with respect to each other and slanted with respect to a fourth edge of said rectangular semiconductor chip which is adjacent to the fourth edge of the central area, wherein two of said first to fourth input/output unit cells being located parallel with respect to each other; and a plurality of corner cells formed in the corner portions.

18. The semiconductor integrated circuit according to claim 17, wherein said corner cells include a power source line, a ground line and an electrostatic protection circuit.

19. The semiconductor integrated circuit according to claim 17, wherein said input/output unit cells formed within an inner side portion are located at a same interval with respect to each other.

20. The semiconductor integrated circuit according to claim 17, wherein said bonding pads formed within an outer side portion are located at a same interval with respect to each other.

21. The semiconductor integrated circuit according to claim 17, wherein all of said input/output unit cells are located parallel with respect to each other.

22. The semiconductor integrated circuit according to claim 17, wherein said first and second input/output unit cells are located parallel with respect to each other and said third and fourth input/output unit cells are located parallel with respect to each other.

23. The semiconductor integrated circuit according to claim 17, wherein each of said input/output unit cells are located so that an entire length thereof between said core area and the inner side portions is slanted with respect to the edges of said rectangular semiconductor chip.

* * * * *